(12) United States Patent
Jeon et al.

(10) Patent No.: US 7,773,429 B2
(45) Date of Patent: Aug. 10, 2010

(54) NON-VOLATILE MEMORY DEVICE AND DRIVING METHOD THEREOF

(75) Inventors: Yoo Nam Jeon, Seongnam-si (KR); Yong Mook Baek, Icheon-si (KR); Keon Soo Shim, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 89 days.

(21) Appl. No.: 12/035,412

(22) Filed: Feb. 21, 2008

(65) Prior Publication Data

US 2008/0205162 A1    Aug. 28, 2008

(30) Foreign Application Priority Data

Feb. 22, 2007   (KR) .................. 10-2007-0017915
May 7, 2007    (KR) .................. 10-2007-0044130
Dec. 27, 2007   (KR) .................. 10-2007-0138567

(51) Int. Cl.
*G11C 16/04* (2006.01)

(52) U.S. Cl. ................... 365/185.28; 365/185.17; 365/185.22; 365/185.29

(58) Field of Classification Search ............. 365/185.17, 365/185.28, 185.22, 185.29
See application file for complete search history.

(56) References Cited

U.S. PATENT DOCUMENTS 7,539,055 B2 *  5/2009  Enda et al. ............. 365/185.18
2004/0252541 A1 * 12/2004 Yang et al. ............... 365/102
2007/0034929 A1 *  2/2007 Hwang et al. .............. 257/314
2007/0253253 A1 * 11/2007 Aritome ................ 365/185.17
2007/0258286 A1 * 11/2007 Higashitani ............ 365/185.14

FOREIGN PATENT DOCUMENTS

| JP | 08-263992 | 10/1996 |
|---|---|---|
| KP | 10-2001-0029937 | 4/2001 |
| KP | 10-2002-0053530 | 7/2002 |
| KP | 10-2005-0069367 | 7/2005 |
| KP | 10-2006-0060528 | 6/2006 |
| KP | 10-2007-0010923 | 1/2007 |
| KP | 10-2007-0018216 | 2/2007 |
| KR | 10-2000-0023005 | 4/2000 |
| KR | 10-2002-0060502 | 7/2002 |
| KR | 10-2006-0060502 | 7/2002 |
| KR | 10-2006-0074179 | 7/2006 |

* cited by examiner

*Primary Examiner*—Hoai V Ho
(74) *Attorney, Agent, or Firm*—Marshall, Gerstein & Borun LLP (57) ABSTRACT

This patent relates to a non-volatile memory device and a driving method thereof The non-volatile memory device includes a source select line in which a floating gate and a control gate are electrically connected to each other, a drain select line in which a floating gate and a control gate are electrically isolated from each other, and a plurality of word lines formed between the source select line and the drain select line.

10 Claims, 4 Drawing Sheets

NON-VOLATILE MEMORY DEVICE AND DRIVING METHOD THEREOF

CROSS-REFERENCES TO RELATED APPLICATIONS

This patent claims priority to Korean patent application numbers 2007-017915, filed on Feb. 22, 2007, 2007-044130, filed on May 07, 2007, and 2007-138567, filed on Dec. 27, 2007 which are incorporated by reference in its entirety.

TECHNICAL FIELD

This patent relates to a non-volatile memory device and driving method thereof.

BACKGROUND

Flash memory is among one of the non-volatile memory devices that may retain its data at power-off. The flash memory device may be an electrically programmable and erasable device that does not need the refresh function of rewriting data at predetermined intervals. The term "program" refers to an operation of writing data into a memory cell and the term "erase" refers to an operation of erasing data written into a memory cell.

The flash memory device may be generally classified as a NOR type flash memory device and an NAND type flash memory device depending on a structure and operating condition of a cell. In the NOR type flash memory device, the drain of each memory cell transistor is connected to a bit line, which enables program and erase with respect to a specific address. The NOR type flash memory device has been generally used for applications requiring a high-speed operation. On the other hand, in the NAND type flash memory device, a plurality of memory cell transistors are connected in series, thus forming one string. The string may be connected to a bit line and a common source line. The NOR type flash memory device facilitates a higher level of integration and is therefore generally used for application fields requiring the retention of a high capacity data.

So far, there is a limitation to the reduction in the memory cell size of a highly integrated flash memory device due to patterning technology and process equipment. Increasing efforts have been devoted to find a viable technology for developing a multi-bit cell that is able to store plural data in one memory cell. The memory cell having this operating method is called a multi-level cell (MLC).

The MLC generally has two or more threshold voltage ($V_t$) distributions and two or more corresponding data storage states. For example, the MLC that is able to program 2-bit data may have four data storage states (i.e., [11], [10], [01] and [00]). The four data storage states correspond to threshold voltage distributions of the MLC, respectively. When a threshold voltage of the MLC corresponds to one of the four threshold voltage distributions, data information of 2 bits, which corresponds to one of [11], [10], [01] and [00], is read. The MLC having insufficient read margin may cause a drop in yield. It is therefore necessary to secure a sufficient read margin between the threshold voltage distributions in each level.

Further, high integration leads to reduction in the width and distance of devices. This results in a disturbance phenomenon between the devices, causing malfunctions of the devices. This is described below in connection with a program operation of a flash memory device.

The program operation may be performed by applying an increased threshold voltage to a word line in order to inject electrons into a floating gate. To this end, a program voltage is applied to a selected word line. As a plurality of memory cells are connected to the selected word line, the memory cells included in the unselected strings may be applied with the program voltage. Consequently, the program operation may be performed on memory cells. A channel boosting may be generated in the unselected strings by controlling the voltage of a select transistor and a bit line in order to prevent electrons from being introduced into the floating gate.

However, during channel boosting, a junction region between a source select transistor and an adjacent memory cell may boost to a specific voltage (for example, 8V) and the gate of the source select transistor is grounded. This corresponds to a condition in which a gate induced drain leakage (GIDL) may be generated at a portion where the source select transistor is overlapped with the junction. Electrons of electron-hole pairs generated at this portion may rapidly move to a channel region in which a high bias has been applied. Further, if the program voltage is applied to the word line nearest to the source select transistor, part of the electrons surpass the floating gate and an unwanted program operation may be carried out.

SUMMARY OF THE INVENTION

An embodiment is directed to secure a sufficient read margin by forming a drain select line to be programmed and programming the drain select line after a word line is programmed, so that the entire word lines experience the same interference phenomenon and narrow threshold voltage distributions are formed accordingly.

Further, another embodiment is directed to prevent an interference phenomenon between select transistors and memory cells by controlling threshold voltages of the select transistors while forming a source select transistor and/or a drain select transistor to have the same size and structure as those of the memory cells.

In an embodiment of the invention, a non-volatile memory device includes a source select line in which a floating gate and a control gate are electrically connected to each other, a drain select line in which the floating gate and the control gate are electrically isolated from each other, and a plurality of word lines formed between the source select line and the drain select line.

In an embodiment of the invention, a programming method of a non-volatile memory device includes providing a source select line in which a floating gate and a control gate are electrically connected to each other, and a plurality of word lines and a drain select line in which a floating gate and a control gate are electrically isolated from each other, performing a program operation on the word lines and on the drain select line, respectively.

In an embodiment of the invention, a programming method of a non-volatile memory device includes providing a first select line in which a floating gate and a control gate are electrically connected to each other, and a plurality of word lines and a second select line in which a floating gate and a control gate are electrically isolated from each other, performing a first program operation on the second select line, performing a second program operation on the plurality of word lines, and performing a third program operation on the second select line.

During the first program operation, a threshold voltage of a memory cell connected to the second select line may become the same level as that of a threshold voltage of a transistor connected to the first select line. The programming method may further include performing an erase operation on the plurality of word lines and the second select line, before the first program operation is performed. The programming method may further includes verifying whether a threshold voltage of a memory cell connected to the second select line has risen to 0V or higher, after the first program operation is performed. During the first program operation, a bit line may be applied with 0V, the first select line may be maintained in a floating state, and the plurality of word lines may be applied with a pass voltage or maintained in a floating state. During the second program operation, a selected word line may be applied with a program voltage and the unselected word lines may be applied with a pass voltage. During the third program operation, a voltage applied to the second select line may be controlled such that an interference phenomenon, affecting the word line adjacent to the second select line, is identical to that generated in the remaining word lines by the second program operation. The first select line may include a source select line, and the second select line may include a drain select line.

In an embodiment of the invention, a non-volatile memory device includes a plurality of memory cells that are connected in series, and a plurality of select transistors formed on both sides of the plurality of memory cells connected in series and configured to have the same structure as that of the memory cells.

In an embodiment of the invention, a non-volatile memory device a includes a plurality of memory cells that are connected in series, a plurality of select transistors formed on both sides of the plurality of memory cells connected in series and configured to have the same structure as that of the memory cells, and a dummy cell formed between the select transistor and the memory cell.

In an embodiment of the invention, a method of driving a non-volatile memory device includes providing a non-volatile memory device including a drain select transistor, a source select transistor and the memory cells, which may be formed over a semiconductor substrate, wherein a floating gate and a control gate of the drain select transistor, the source select transistor and the memory cells are isolated by a dielectric layer, performing a program operation so that threshold voltages of the drain select transistor and the source select transistor become higher than a ground voltage, and performing a program operation, an erase operation or a read operation on the memory cells using the programmed drain select transistor and the programmed source select transistor.

The program operation includes controlling the threshold voltages of the source select transistor and the drain select transistor, turning off the source select transistor, turning on the drain select transistor, applying a program voltage to the control gate of a selected one of the memory cells, and applying a pass voltage to the control gates of the remaining memory cells other than the selected memory cell.

The erase operation includes making floated the control gates of the source select transistor and the drain select transistor, applying the ground voltage to the control gates of the memory cells, and applying an erase voltage to a well of the semiconductor substrate.

The read operation includes turning on the source select transistor and the drain select transistor, applying a ground voltage to the control gate of a selected one of the memory cells, and applying a pass voltage to the control gates of the remaining memory cells other than the selected memory cell.

BRIEF DESCRIPTION OF THE DRAWINGS

For a more complete understanding of the disclosure, reference should be made to the following detailed description and accompanying drawings wherein.

DESCRIPTION OF SPECIFIC EMBODIMENTS

This patent is not limited to the disclosed embodiments, but may be implemented in various manners. The embodiments are provided to complete the disclosure of this patent and to allow those having ordinary skill in the art to understand the scope of this patent defined by the appended claims.

Figure 1A:
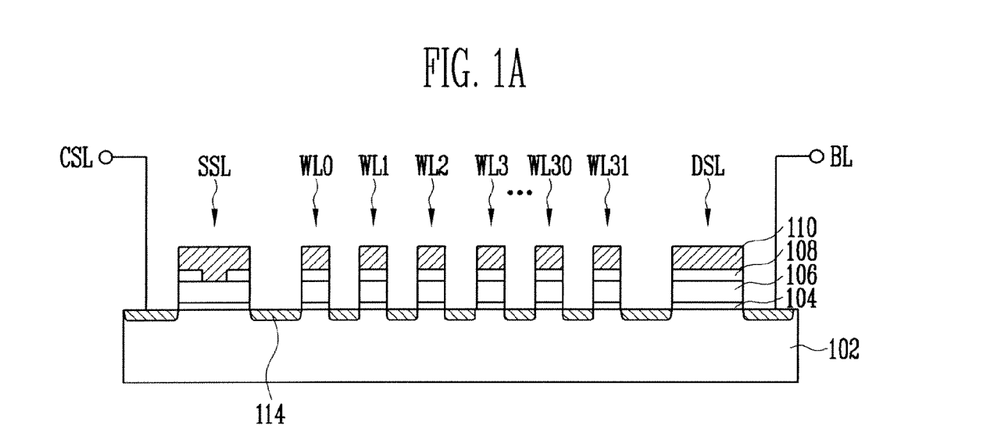
FIG. 1A is a sectional view of a non-volatile memory device according to a first embodiment of the invention.

Referring now to FIG. 1A, a source select line (SSL), word lines WL0 to WL31 and a drain select line (DSL) are formed in parallel at predetermined intervals over a semiconductor substrate 102. The SSL may be connected to the gates of source select transistors. The source select transistors may be selected by the SSL and thus operated. The source of the source select transistor may be electrically connected to a common source line (CSL). Generally, 16, 32 or 64 word lines may be formed between the SSL and the DSL. In an embodiment of the invention, 32 word lines WL0 to WL31 may be formed, but only six of the word lines are illustrated as an example.

The word lines WL0 to WL31 and the DSL may have a structure in which a gate insulating layer 104, a first conductive layer 106 for a floating gate, a dielectric layer 108, and a second conductive layer 110 for a control gate are laminated over the semiconductor substrate 102. As shown, the floating gate 106 and the control gate 110 of the DSL are electrically insulated from each other. Thus, a device connected to the DSL may operate as a memory cell. The drain of the memory cell connected to the DSL may be electrically connected to a bit line (BL). Similarly, the word lines WL0 to WL31 may be formed to have the same structure as the DSL. The first and second conductive layers 106, 110 may be formed from polysilicon. The dielectric layer 108 may have an ONO (Oxide/Nitride/Oxide) structure in which an oxide layer, a nitride layer and an oxide layer are laminated sequentially. A low-k layer (not shown) may be formed over the second conductive layer 110. The low-k layer may have a stack layer including metal silicide and a hard mask. An ion implantation process may be performed in order to form junction regions 114 in the semiconductor substrate 102 between the SSL and the word line WL0, between the word lines WL0 to WL31, and between the word line WL31 and the DSL.

Unlike the word lines WL0 to WL31 and the DSL, the SSL may have a structure in which the first and second conductive layers 106, 110 are electrically connected to each other through a predetermined process for example, the first conductive layer 106 for the floating gate and the second conductive layer 110 for the control gate, of the source select line SSL, may be electrically connected to each other by removing all or part of the dielectric layer 108 in the SSL. Alternatively, a plug (not shown) may be formed in the SSL so that the first and second conductive layers 106, 110 are electrically connected to each other in a subsequent process.

In the prior art, the DSL was formed to have the same structure as the SSL, which made it impossible to program the DSL. In a typical program operation, the word line WL31 which is adjacent to the DSL is programmed lastly. At this time, previously programmed word lines WL0 to WL30 may experience the interference phenomenon when an adjacent word line WL31 is subsequently programmed, so that the threshold voltages of the previously programmed word lines WL0 to WL30 are changed.

In an embodiment of the invention, the word lines WL0 to WL30, which are previously programmed than the last programmed word line WL31, undergo the same interference phenomenon and, therefore, the threshold voltages of the word lines WL0 to WL30 are changed equally. However, since the last programmed word line WL31 does not experience the interference phenomenon thus, there is no change in the threshold voltage of the word line WL31 due to the programming of the adjacent word lines WL0 to WL30. This is described in more detail below with reference to FIG. 2.

Figure 2:
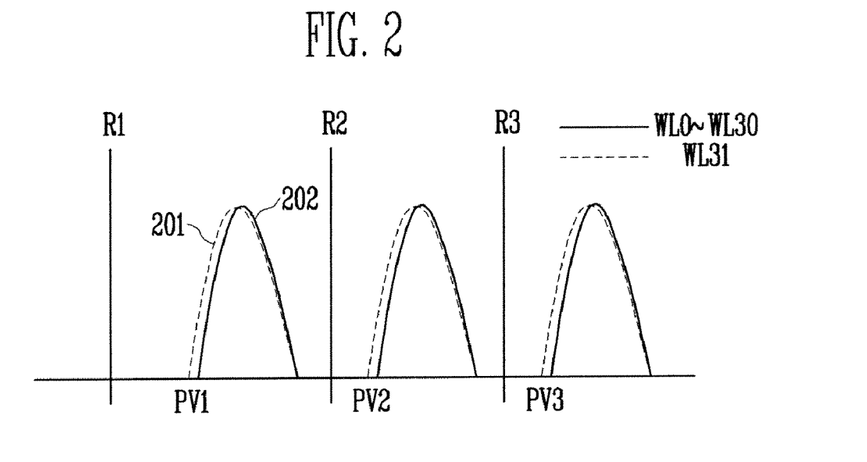
FIG. 2 is a view illustrating threshold voltage distributions of word lines.

Referring to FIG. 2, a threshold voltage distribution 201 of the word line WL31, which does not experience an interference phenomenon after programming, is relatively wider than threshold voltage distributions 202 of the word lines WL0 to WL30 that undergo the interference phenomenon. At least one or more of the word lines WL0 to WL30 may not experience the interference phenomenon when neighboring cells are in an erase state. However, since the last programmed word line WL31 does not experience an interference phenomenon, the threshold voltage distribution 201 of the word line WL31 is wider than the threshold voltage distributions 202 of the word lines WL0 to WL30. Consequently, a read margin between verify voltages PV1 to PV3 and read voltages R1 to R3 may be decreased, resulting in a reduced program throughput.

In an embodiment of the invention, if the DSL adjacent to the last programmed word line WL31 is formed in such a way to be programmed, and the DSL is programmed after the word line WL31 is programmed, the word line WL31 may experience an interference phenomenon in the same manner as the previously programmed word lines WL0 to WL30. Hence, the entire word lines WL0 to WL31 experience the same interference phenomenon, so the width of a threshold voltage level of the word line WL31 is narrowed in the same manner as the width of the word lines WL0 to WL30. Accordingly, the read margin between the verify voltages PV1 to PV3 and the read voltages R1 to R3 may be increased, leading to an improved program throughput.

Figure 1B:
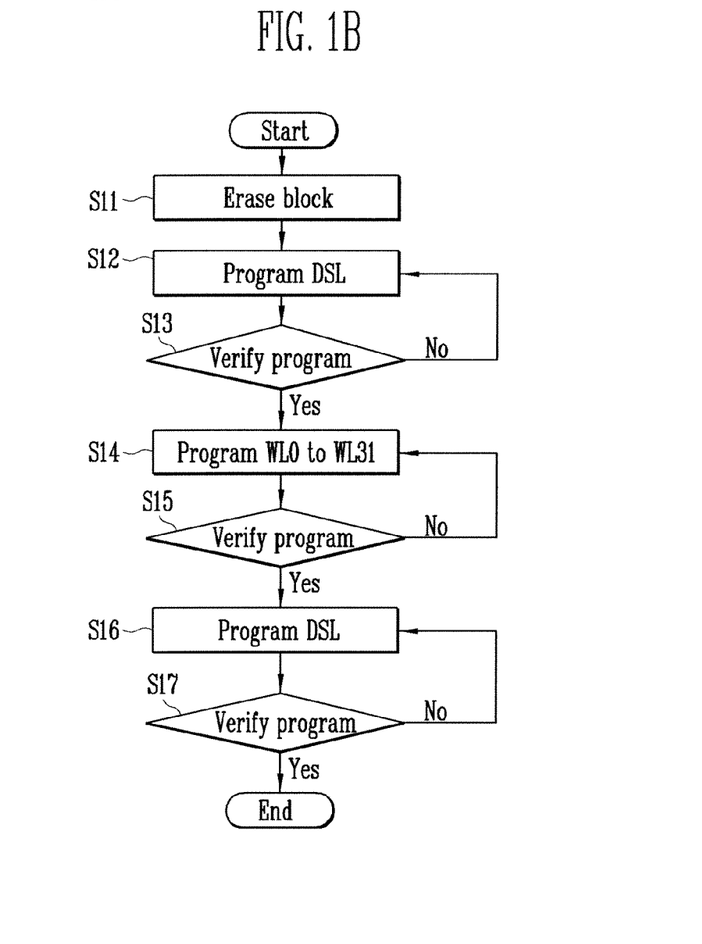
FIG. 1B is a flowchart illustrating a programming method employing the non-volatile memory device according to a first embodiment of the invention.

A programming method of the non-volatile memory device is described with reference to FIG. 1B. The entire word lines WL0 to WL31 and the drain select line DSL to be programmed are erased in step S11. The erase operation may be performed by applying 0V to both the word lines WL0 to WL31 and the DSL, for example by applying an erase bias to a bulk. Thus, a memory cell connected to the DSL is also erased and the threshold voltage is lowered. At this time, the SSL is set in a floating state.

Before the word lines WL0 to WL31 are programmed, a voltage (the ground voltage or the power supply voltage) supplied through the BL to program the word lines WL0 to WL31 may be transferred to a channel region of the word lines WL0 to WL31. This may be performed by a drain select transistor connected to the DSL. A memory cell may be connected to the DSL, so that the memory cell connected to the DSL may serve as the drain select transistor.

Here, the threshold voltage of the memory cell connected to the DSL becomes lower than 0V during the erase operation. Thus, the threshold voltage of the memory cell is raised to have the same level as the threshold voltage of a typical transistor or a transistor connected to the SSL so that the memory cell connected to the DSL may serve as a transistor. A program operation is performed on the DSL in step S12. It is then verified whether the threshold voltage of the memory cell connected to the DSL has risen up to a level (for example, 0V or higher) of the threshold voltage of a typical transistor or a transistor connected to the SSL in step S 13. During the program operation, the entire bit lines are applied with 0V and the SSL is set in a floating state. The word lines WL0 to WL31 may be applied with a pass voltage and the word lines WL0 to WL31 may be set in a floating state.

Figure 3:
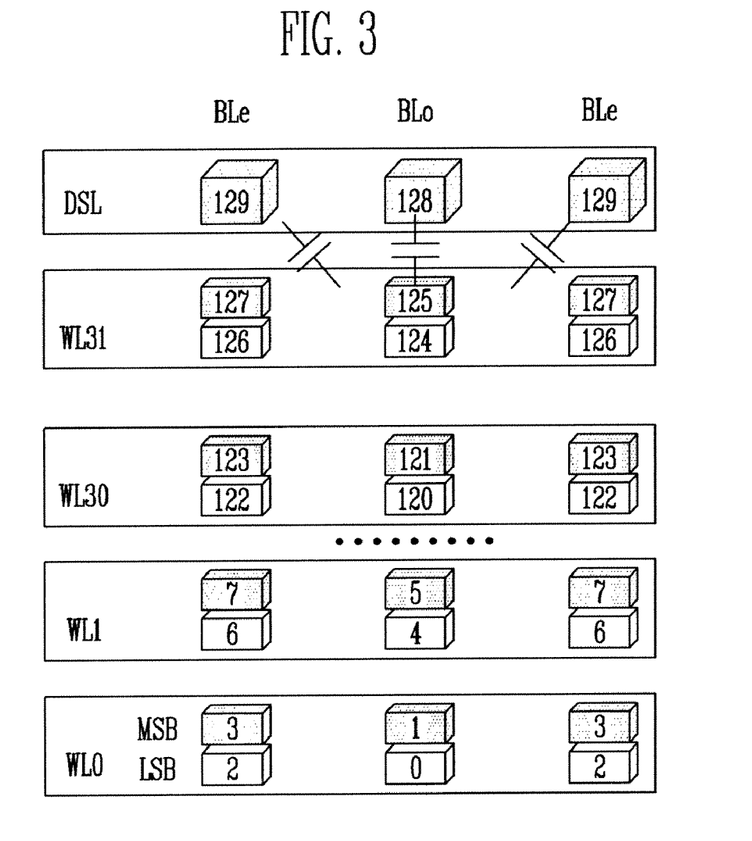
FIG. 3 is a schematic diagram illustrating a programming method employing the non-volatile memory device according to a first embodiment of the invention.

After the program operation on the drain select line DSL is completed, the word lines WL0 to WL31 are programmed by selectively applying a program voltage and the pass voltage to the word lines WL0 to WL31 in step S14. It is then verified whether the program operation has been successfully performed on the word lines WL0 to WL31 in step S15. During the program operation, selected word lines WL0 to WL31 are applied with a program voltage and unselected word lines WL0 to WL31 are applied with the pass voltage. Meanwhile, the program operation on the word lines WL0 to WL31 may be performed such that LSB programming and MSB programming are performed on memory cells connected to the first word line WL0 and an odd bit line BL0, LSB programming and MSB programming are performed on memory cells connected to an even bit line BLe, and LSB programming and MSB programming are performed on a next word line WL1, as shown in FIG. 3.

In order to exert the last programmed word line WL31 on an interference phenomenon, the DSL is reprogrammed in step S16 and verification is then performed in step S17. When reprogramming the DSL, the level of a voltage applied to the DSL may be controlled such that the last programmed word line WL31 may also experience an interference phenomenon in the same manner as the previously programmed word lines WL0 to WL30 are experienced by the interference phenomenon.

If a read bias is applied to the DSL even though the DSL has been programmed, a memory cell to be read may be electrically connected to the BL.

Figure 4:
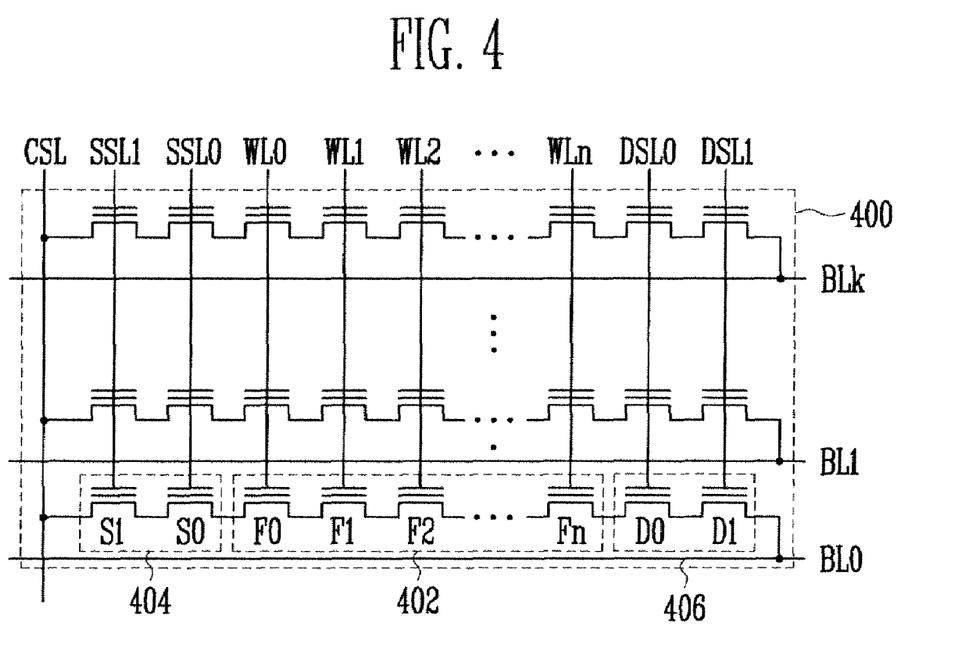
FIG. 4 is a circuit diagram of a non-volatile memory device according to a second embodiment of the invention.

Referring to FIG. 4, a flash memory device includes a memory cell array 400 for storing data. The memory cell array 400 includes a plurality of strings connected by bit lines BL0 to BLk. Each string includes a memory unit 402, a source select line unit 404 and a drain select line unit 406. The memory unit 402 includes a plurality of memory cells F0 to Fn that are connected in series through a junction. Data may be stored in each of the memory cells F0 to Fn. The source select line unit 404 may be connected between a common source line (CSL) and the memory unit 402. The source select line unit 404 includes a plurality of source select transistors S0 and S1 formed on both sides of the plurality of memory cells F0 to Fn connected in series and configured to have the same structure as that of the memory cells F0 to Fn. The drain select line unit 406 connected between the memory unit 402 and the bit line BL0 may include a plurality of drain select transistors D0 and D1. A dummy cell (not shown) may be formed between the select transistor 404 and/or 406 and the memory cell 402.

Figure 5:
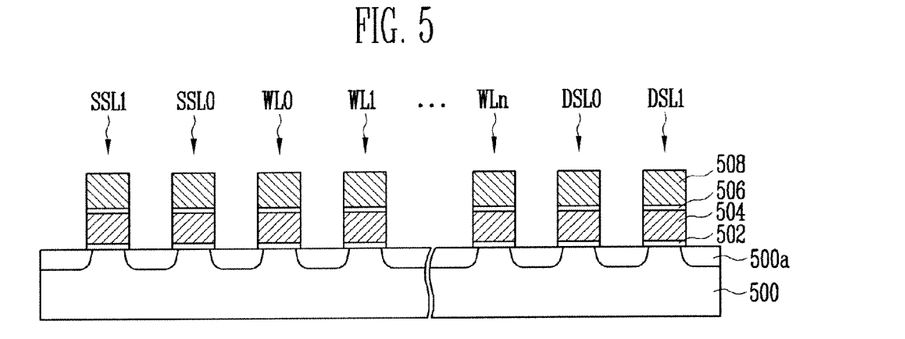
FIG. 5 is a sectional view of the non-volatile memory device according to a second embodiment of the invention.

Referring to FIG. 5, a gate insulating layer 502, a first conductive layer 504 for a floating gate, a dielectric layer 506 and a second conductive layer 508 for a control gate are formed over a semiconductor substrate 500, and may then patterned, thus forming a plurality of word lines WL0 to WLn, source select lines SSL0 and SSL1, and drain select lines DSL0 and DSL1. The pattering process may be performed such that the word lines WL0 to WLn, and the source and drain select lines SSL0, SSL1, DSL0 and DSL1 have a uniform size. An ion implantation process may be preformed on an exposed semiconductor substrate 500 in order to form junctions 500a. A string structure, including the plurality of word lines WL0 to WLn, the source select lines SSL0 and SSL1, and the drain select lines DSL0 and DSL1, is thereby formed. Each of the source select lines SSL0 and SSL1 and the drain select lines DSL0 and DSL1 may be formed in pairs or more. A nitride layer may be formed as a charge trap layer instead of the first conductive layer 504.

In the source and drain select lines SSL0, SSL1, DSL0 and DSL1 and the word lines WL0 to Wn, the first conductive layer 504 and the second conductive layer 508 are isolated from each other by the dielectric layer 506. In order for the source and drain select lines SSL0, SSL1, DSL0 and DSL1 to serve as existing select transistors, a driving method, such as control of the threshold voltage, is different from the existing method. This driving method is described hereinafter.

In general, in the case where any one memory cell selected from the plurality of memory cells F0 to Fn is programmed, a disturbance phenomenon may occur in which electrons are introduced into a floating gate (or a charge trap layer) of an adjacent memory cell between a select transistor and the adjacent memory cell.

To prevent this phenomenon, a voltage applied to the select transistor and the neighboring memory cell may be lowered than a voltage applied to another memory cell in order to prohibit the creation of hot electrons.

As another method, the arrival probability of the hot electrons may be lowered by widening a distance between the select transistor and the neighboring memory cell so as to increase the migration distance of the electrons upon channel boosting. Alternatively, a dummy cell may be formed between the select transistor and the neighboring memory cell so that the disturbance phenomenon occurs in the dummy cell instead of the memory cell.

However, the above methods employ a select transistor having a width wider than a memory cell and are not advantageous in reducing the size of a chip according to an increased level of integration. For example, if a memory cell has the length of 45 nm to 50 nm when a select transistor is 200 nm to 250 nm in length, a distance between the select transistor and an adjacent cell is 70 nm to 90 nm for the purpose of a stable operation of a device. If the distance is smaller than 70 nm to 90 nm, it becomes very difficult to form a dummy cell.

In an embodiment of the invention, the source select transistors S0 and S1 and/or the drain select transistors D0 and D1 may be formed to have the same structure and size as those of the memory cells F0 to Fn and may be formed in the source select line unit 404 and the drain select line unit 406, respectively, in pair. However, it is to be understood that although FIGS. 4 and 5 illustrate two select transistors S0 and S1 and the two drain select transistors D0 and D1 may be formed, the number of each of the select transistors S0 and S1 and the drain select transistors D0 and D1 may be formed to have at least two or more according to a size.

The select transistors S0, S1, D0 and D1 may have a different structure and size when compared with the existing select transistors. In order for the select transistors S0, S1, D0 and D1 of the invention to play the same role as the existing select transistors, a driving method may be different from the existing driving method. The driving method of the present invention is described below.

First, a first program operation may be performed by performing a pre-program operation. The pre-program operation for applying a specific voltage to the source and drain select lines SSL0, SSL1, DSL0 and DSL1 may be performed in order to increase the threshold voltages of the source and drain select transistors S0, S1, D0 and D1 to 0.7V to 1.0V. The control gates 508 of the source select lines SSL0 and SSL1 may be applied with a ground voltage (for example, 0V) and the control gates 508 of the drain select lines DSL0 and DSL1 are applied with a voltage (for example, 4.5V) for turning on the drain select transistors D0 and D1. The control gates 508 of the remaining word lines other than a selected word line of the word lines WL0 to WLn may be applied with a pass voltage and the selected word line may be applied with a program voltage, thus programming a selected memory cell.

A first erase operation may be performed wherein a well of the semiconductor substrate 500 may be applied with an erase voltage (for example, 20V) and the control gates 508 of the word lines WL0 to WLn may be applied with a ground voltage (for example, 0V), thereby erasing the entire memory cells F0 to Fn included in the same block as shown in FIG. 4. The control gates 508 of the select transistors S0, S1, D0 and D1 may be preferably maintained in a floating state in order to generate channel boosting per on a string basis.

A first read operation may be performed wherein a selected bit line is precharged and each of the control gates 508 of the select lines SSL0, SSL1, DSL0 and DSL1 may be applied with a turn-on voltage. The control gate 508 of a selected one of the word lines WL0 to WLn may be applied with a ground voltage and the control gates 508 of the remaining word lines other than the selected word line are applied with the read voltage. The read operation may be performed by determining whether the voltage of the bit line has decreased or not.

A second program operation may be performed wherein a pre-program operation for applying a specific voltage to the source and drain select lines SSL0, SSL1, DSL0 and DSL1 may be performed in order to raise the threshold voltages of the source and drain select transistors S0, S1, D0 and D1. Specifically, the threshold voltages of the drain select transistors D0 and D1 are increased up to 0.7V to 1.0V. In particular, the threshold voltages of the source select transistors S0 and in step S1, which are vulnerable to GIDL, be increased to threshold voltages that do not generate GIDL. For example, the threshold voltages of the source select transistors S0 and S1 may be increased to 4V to 5V. Thereafter, the control gates 508 of the source select lines SSL0 and SSL1 may be applied with a voltage (for example, 3V), which is lower than a turn-on voltage of the source select transistors S0 and S1. The control gates 508 of the drain select lines DSL0 and DSL1 may be applied with a voltage (for example, 4.5V) for turning on the drain select transistors D0 and D1. The remaining word lines other than a selected word line of the word lines WL0 to WLn may be applied with a pass voltage and the selected word line may be applied with a program voltage, thereby programming a selected memory cell.

A second erase operation may be performed wherein a well of the semiconductor substrate 500 is applied with an erase voltage (for example, 20V) and the control gates 508 of the word lines WL0 to WLn are applied with a ground voltage (for example, 0V), so that the entire memory cells F0 to Fn included in the same block are erased at the same time. At this time, the control gates 508 of the select transistors S0, S1, D0 and D1 are maintained in a floating state so that channel boosting is generated per on a string basis.

A second read operation may be performed wherein a selected bit line is precharged, and the control gates 508 of the select lines SSL0, SSL1, DSL0 and DSL1 may be applied with a turn-on voltage. Here, since the threshold voltages of the source select transistors S0 and S1 have increased, it is preferred that the turn-on voltages of the source select transistors S0 and S1 be applied with 7V to 8V. The turn-on voltages of the drain select transistors D0 and D1 can be applied with a voltage (for example, 4.5V). Thereafter, the control gate 508 of a selected one of the word lines WL0 to WLn is applied with a ground voltage and the control gates 508 of the remaining word lines other than the selected word line are applied with read voltages. At this time, the read operation may be performed by determining whether the voltage of the bit line has decreased or not.

In the above operation method of the invention, electrons generated in the source select line unit 404 may be captured in the source select transistor S0 included in the source select line unit 404 or may have its migration prohibited by the increased threshold voltage of the source select transistor S0. Accordingly, the occurrence of a disturbance phenomenon in which unnecessary electrons are introduced into the memory cells F0 to Fn of the memory unit 402 may be prevented.

Further, since a contact hole formation process (a process of electrically connecting the floating gate and the control gate) in the select transistors can be omitted, the fabrication process of a non-volatile memory device is simplified. The size of a semiconductor chip can be reduced since a select transistor having a size smaller than that of the existing select transistor is used.

Figure 6:
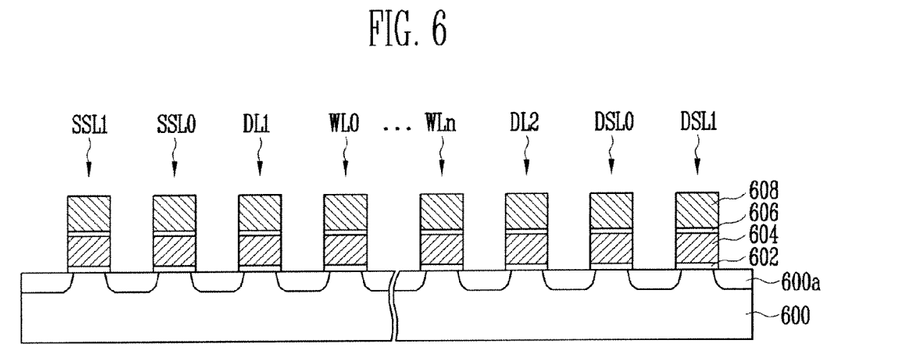
FIG. 6 is a sectional view of a non-volatile memory device according to a third embodiment of the invention.

Referring now to FIG. 6, a gate insulating layer 602, a first conductive layer 604 for a floating gate, a dielectric layer 606 and a second conductive layer 608 for a control gate may be formed over a semiconductor substrate 600 and then patterned, thus forming word lines WL0 to WLn, source select lines SSL0 and SSL1 and drain select lines DSL0 and DSL1. The patterning process may be performed such that the word lines WL0 to WLn, and the source and drain select lines SSL0, SSL1, DSL0 and DSL1 have a uniform width. An ion implantation process may then be performed on an exposed semiconductor substrate 600 in order to form junctions 600a. A string structure, including the word lines WL0 to WLn, the source select lines SSL0 and SSL1, and the drain select lines DSL0 and DSL1, is thereby formed. Each of the source select lines SSL0 and SSL1 and the drain select lines DSL0 and DSL1 may be formed in pairs or more.

Dummy lines DL1 and DL2 comprise of dummy cells may be formed in plural numbers in consideration of the degree of integration of a device or the size of a chip. The dummy lines DL1 and DL2 may be formed between the source select line SSL0 and the word line WL0 and/or between the drain select line DSL0 and the word line WLn.

A driving method of the nonvolatile memory device includes a program operation, an erase operation, and a read operation.

During the program operation, the control gates 608 of the source select lines SSL0 and SSL1 may be applied with a ground voltage and the control gates 608 of the drain select lines DSL0 and DSL1 may be applied with a voltage (for example, 3V) for turning on the drain select transistors.

The remaining word lines other than a selected one of the word lines WL0 to WLn may be applied with a pass voltage and the selected word line may be applied with a program voltage, thereby programming a selected memory cell.

During the erase operation, a well of the semiconductor substrate 600 may be applied with an erase voltage (for example, 20V) and the control gates 608 of the word lines WL0 to WLn may be applied with a ground voltage, thereby erasing the entire memory cells F0 to Fn included in the same block, as shown in FIG. 4. Here, since the select transistors S0, S1, D0 and D1 may be erased at the same time, the control gates 608 of the select lines SSL0, SSL1, DSL0 and DSL1 may be maintained in a floating state and therefore maintain a potential programmed into the floating gates 604.

During the read operation, each of the control gates 608 of the select lines SSL0, SSL1, DSL0 and DSL1 may be applied with a read voltage and the control gate 608 of a selected word line of the word lines WL0 to WLn may be applied with a ground voltage. The control gates 608 of the remaining word lines other than the selected word line are applied with read voltages.

In an embodiment of the invention, the drain select line is formed in such a way to be programmed, and the drain select line is programmed after the word line is programmed. This makes the entire word lines experience the same interference phenomenon, so that narrow threshold voltage distributions may be formed and a sufficient read margin may be secured. Accordingly, since a peak value of a program threshold voltage is lowered, a program time can be reduced and the performance of a semiconductor device an be improved.

In another embodiment of the invention, the source select transistor and/or the drain select transistor may be formed to have the same size and structure as those of the memory cells, the threshold voltages of the select transistors are controlled. Accordingly, a process of forming a dielectric layer contact hole in the select transistors may be omitted, thereby simplifying the process, and the select transistors may be formed smaller than the existing select transistors, thus reducing the chip size. Further, since the threshold voltages of the select transistors are increased, program disturbance and an interference phenomenon between a transistor and a memory cell can be prevented.

The present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

What is claimed is:

1. A non-volatile memory device comprising:
   only a source select transistor in which a first floating gate and a first control gate are electrically connected to each other;
   only a drain select transistor line in which a second floating gate and a second control gate are electrically isolated from each other; and
   a plurality of memory cells formed between the source select transistor and the drain select transistor, wherein the source select transistor, the plurality of memory cells and the drain select transistor are connected together in series.

2. A programming method of a non-volatile memory device, comprising:
   providing a source select transistor in which a floating gate and a control gate are electrically connected to each other, and a plurality of memory cells and a drain select transistor in which a floating gate and a control gate are electrically isolated from each other, wherein the source select transistor, the plurality of memory cells and the drain select transistor are connected together in series;

performing a first program operation on the memory cells; and performing a second program operation on the drain select transistor.

3. A programming method of a non-volatile memory device, comprising:

providing a first select transistor in which a floating gate and a control gate are electrically connected to each other, and a plurality of memory cells and a second select transistor in which a floating gate and a control gate are electrically isolated from each other, wherein the first select transistor, the plurality of memory cells and the second select transistor are connected together in a series;

performing a first program operation on the second select transistor;

performing a second program operation on the plurality of memory cells; and performing a third program operation on the second select transistor.

4. The programming method of claim 3, wherein during the first program operation, a threshold voltage of a memory cell connected to the second select transistor becomes the same level as that of a threshold voltage of he second select transistor.

5. The programming method of claim 3, further comprising performing an erase operation on the plurality of memory cells and the second select transistor, before the first program operation is performed.

6. The programming method of claim 3, further comprising verifying whether a threshold voltage of the second select transistor has risen to 0V or higher, after the first program operation is performed.

7. The programming method of claim 3, wherein during the first program operation, a bit line connected to the second select transistor is applied with 0V, the first select transistor is maintained in a floating state, and the plurality of memory cells connected to the memory cells are applied with a pass voltage or maintained in a floating state.

8. The programming method of claim 3, wherein during the second program operation, word line connected to a selected memory cell is applied with a program voltage and unselected word lines connected to unselected memory cells are applied with a pass voltage.

9. The programming method of claim 3, wherein during the third program operation, a voltage applied to the second select transistor is controlled such that an interference phenomenon, affecting the memory cell adjacent to the second select transistor, is identical to that generated in the remaining word lines by the second program operation.

10. The programming method of claim 3, wherein the first select transistor includes a source select transistor, and the second select transistor includes a drain select transistor.

* * * * *